United States Patent
Woo et al.

(10) Patent No.: US 8,411,054 B2
(45) Date of Patent: Apr. 2, 2013

(54) INPUT DEVICE OF TOUCH PANEL TYPE FOR VEHICLE

(75) Inventors: Sung Il Woo, Gwangju (KR); Dong Ok Kim, Gyeonggi-Do (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 394 days.

(21) Appl. No.: 12/763,524

(22) Filed: Apr. 20, 2010

(65) Prior Publication Data

US 2011/0134054 A1    Jun. 9, 2011

(30) Foreign Application Priority Data

Dec. 4, 2009 (KR) .................. 10-2009-0120174

(51) Int. Cl.
  *G06F 3/041* (2006.01)
  *G08B 5/00* (2006.01)
(52) U.S. Cl. .......... 345/173; 345/156; 345/168; 701/36; 340/815.4; 178/18.06
(58) Field of Classification Search .......... 345/156–158, 345/172–174, 168–169; 178/18.01–18.09; 340/815.4; 701/36
See application file for complete search history.

(56) References Cited

U.S. PATENT DOCUMENTS

| 2005/0090946 A1* | 4/2005 | Pickering et al. .................. 701/2 |
| 2005/0133347 A1* | 6/2005 | Hein .............................. 200/5 R |
| 2007/0035652 A1* | 2/2007 | Toyoda et al. ........... 348/333.05 |
| 2007/0046642 A1* | 3/2007 | Lee et al. ........................ 345/173 |
| 2008/0180585 A1* | 7/2008 | Kubota et al. .................... 349/12 |
| 2009/0140994 A1* | 6/2009 | Tanaka et al. ................. 345/173 |
| 2010/0244682 A1* | 9/2010 | Lee et al. ....................... 313/512 |
| 2010/0289759 A1* | 11/2010 | Fisher et al. .................. 345/173 |

FOREIGN PATENT DOCUMENTS

JP  2008-033701 A  2/2008

* cited by examiner

*Primary Examiner* — Lun-Yi Lao
*Assistant Examiner* — MD Saiful A Siddiqui
(74) *Attorney, Agent, or Firm* — Edwards Wildman Palmer LLP; Peter F. Corless

(57) ABSTRACT

The present invention features an input device for a touch panel type for a vehicle, wherein, by replacing the conventional switch of a tact type into a touch panel using an electric field sensor, it is able to change an analog input method according to an operation of the conventional switch of the tact type into a digital input method according to electric signals, and also, by a touch panel of a button-integrated type that senses a change of an electric field, it is able to improve utilization of the inner space in the vehicle, and for unifies the panel.

16 Claims, 15 Drawing Sheets

INPUT DEVICE OF TOUCH PANEL TYPE FOR VEHICLE

CROSS-REFERENCE TO RELATED APPLICATION

The present application claims priority to Korean Patent Application Number 10-2009-0120174, filed on Dec. 4, 2009, the entire contents of which are incorporated herein for all purposes by reference.

BACKGROUND OF THE INVENTION

1. Field of the Invention

The present invention relates, generally, to an input device of a touch panel type for a vehicle, and more particularly to a panel input device of a touch panel type which provides an electrical input signal by a touch panel of a digital input method, wherein the touch panel uses a sensor for sensing an electric field.

2. Background Art

Generally, in a vehicle, various convenience apparatuses, such as an air conditioner, a heater, an audio system, a navigation system, are arranged and used for the convenience of a driver. For example, an audio system is an example of a convenience apparatus in a vehicle.

A cassette player and a radio may be included in the audio system for a vehicle. Further, various apparatuses such as a compact disk player, an MP3 player (Moving Pictures Experts Group 3 Player), a mini disk player, or the like may also be included in the audio system, and may be arranged by the driver. Recently, as various memory card slots have been applied to the audio system for vehicle, it is possible to provide an extensible audio system for vehicle to users.

Further, in the inside of the vehicle, there is an interface for controlling operation of the audio system, and a window for displaying the status of the operation, that is preferably referred to as a front panel.

Recently, as driver preferences have changed, and the audio systems have added more functions, more buttons are included in the audio system so that the buttons may control many functions and may display the status of the functions. However, the area of the front panel of the audio system was limited in the inside of the vehicle, and accordingly, a structure with a lot of buttons and windows can be complicated in a limited area.

FIG. 1 is a view for illustrating an exemplary audio front panel of a buttoned switch type according to the prior art, and FIG. 2 is a section view of a button in the audio front panel of an exemplary buttoned switch type according to a prior art.

Referring to FIG. 1, a plurality of buttons 11 are equipped in the audio front panel 10 of a buttoned switch type according to the prior art. Preferably, since parting lines may be produced at the front side of the audio front panel 10, a sense of unity of design may be lost, and buttons may be excessively exposed. In addition, as shown in FIG. 2, since a space for mounting the buttons of at least 16 mm is required, the space for button size must be adequately secured in order to ensure button sensitivity, and accordingly, it may cause a problem that it may be not applied to the simple design. Further, a cost for manufacturing the button may increase since molding dies are suitably manufactured for each of the buttons, respectively, and it is not possible to manage steps between the buttons. Moreover, since it is difficult to apply various materials, a surface finishing process may be not easily performed.

Accordingly, there is a need in the art for input devices for a touch panel type for a vehicle.

The above information disclosed in this the Background section is only for enhancement of understanding of the background of the invention and therefore it may contain information that does not form the prior art that is already known in this country to a person of ordinary skill in the art.

BRIEF SUMMARY OF THE INVENTION

In tone aspect, the present invention provides an input device for a touch panel type for a vehicle, wherein, by replacing the conventional switch of a tact type into a touch panel using an electric field sensor, it is able to change an analog input method according to an operation of the conventional switch of the tact type into a digital input method according to electric signals.

In further preferred embodiments, the present invention provides an input device for a touch panel type for a vehicle, wherein, by a button-integrated type touch panel for sensing a change of an electric field, the input device is able to improve utilization of the inner space in the vehicle, and unify the panel.

In another preferred embodiment, the present invention features an input device for a touch panel type for a vehicle, in which the input device preferably includes a window panel comprising a front side of a front panel and a front board comprising a rear side of the front panel, the input device comprising a touch cell sensor unit composed of a plurality of touch cells for sensing a change of pulse corresponding to change of electric field and for inputting a signal; and an LED driving unit for suitably providing a lighting as a feedback in case of touching the touch cell, wherein each of the touch cells suitably inputs the signal by sensing the change of the pulse corresponding to the change of electric field in the case of being touched, respectively.

In another preferred embodiment of the present invention, the input device may additionally include an LED guide suitably formed at the rear side of the window panel, wherein the LED guide is part of a body for controlling the lighting between buttons.

Preferably, in certain embodiments, the window panel and the touch cell sensor unit may be suitably integrated with each other for constituting a touch panel of a button-integrated type.

Preferably, in other further embodiments, the touch cell sensor unit may be a touch cell formed by a method of ASIC (Application-Specific Integrated Circuit), and it may be suitably mounted on a flexible PCB (FPCB).

In still other embodiments, the LED driving unit may be suitably mounted on a flexible PCB (FPCB).

In other preferred embodiments of the present invention, as the feedback information in touching the touch cell, a beep sound may be provided.

In still other preferred embodiments of the present invention, as the feedback information in touching the touch cell, the lighting may be suitably provided by a touch LED.

Preferably, in certain preferred embodiments, the window panel and the touch cell sensor unit may be mutually attached using a double-sided tape.

Preferably, in other preferred embodiments, the input device of the touch panel type may be used for a panel input device including an audio front panel and a navigation front panel, or the input device of the touch panel type is used for a switch for an air conditioner or a switch for a heater.

In another preferred embodiment, the present invention features an audio front panel for a touch panel type for a vehicle, the audio front panel preferably comprising a window panel for suitably representing an outside of the audio front panel; a touch cell sensor unit for being suitably attached to an outside of the window panel, and being composed of a lot of touch cells for sensing a change of electric field in case of touching; an LED driving unit for suitably providing a lighting as a feedback in case of touching the touch cell; an LED guide for being suitably formed at the rear side of the window panel, and for playing a role in a body for controlling the lighting between buttons; and a front board for suitably constituting a rear side of the audio front panel, and providing an interface between an audio box and the touch cell sensor unit.

Preferably, the window panel and the touch cell sensor unit may be suitably integrated with each other for constituting a touch panel of a button-integrated type.

Preferably, the touch cell sensor unit may be a touch cell formed by a method of ASIC (Application-Specific Integrated Circuit), and it may be suitably mounted on a flexible PCB (FPCB).

Preferably, the LED driving unit may be suitably mounted on a flexible PCB (FPCB).

In another preferred embodiment of the present invention, as the feedback information in touching the touch cell, a beep sound is suitably provided, and the lighting is suitably provided by a touch LED.

Preferably, the window panel and the touch cell sensor unit may be mutually attached using a double-sided tape.

According to other preferred embodiments of the present invention, by replacing the conventional switch of a tact type into a touch panel using an electric field sensor, it is possible to change an analog input method according to an operation of the conventional switch of the tact type into a digital input method according to electric signals.

According to other preferred embodiments of the present invention, by suitably applying a front panel using a touch sensor (electric field) into components for a vehicle, it is possible to increase a degree of freedom for designing the next generation automobile vehicle, and seek to enlarge the merchantability.

According other preferred embodiments of the present invention, by a touch panel of a button-integrated type for sensing a change of an electric field, it is possible to suitably improve utilization of the inner space in the vehicle, and unify the panel.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum).

As referred to herein, a hybrid vehicle is a vehicle that has two or more sources of power, for example both gasoline-powered and electric-powered.

The above features and advantages of the present invention will be apparent from or are set forth in more detail in the accompanying drawings, which are incorporated in and form a part of this specification, and the following Detailed Description, which together serve to explain by way of example the principles of the present invention.

BRIEF DESCRIPTION OF THE DRAWINGS

The above and other features of the present invention will now be described in detail with reference to certain exemplary embodiments thereof illustrated by the accompanying drawings which are given hereinafter by way of illustration only, and thus are not limitative of the present invention, and wherein.

Figure 1:
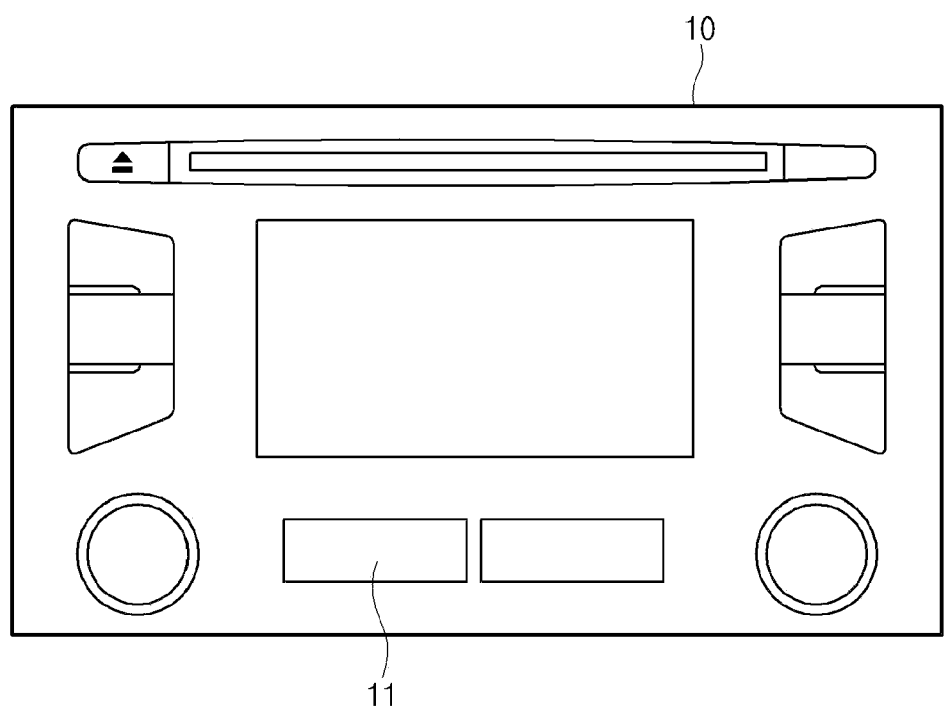
FIG. 1 is an exemplary view for illustrating an audio front panel of a buttoned switch type according to a prior art.
Figure 2:
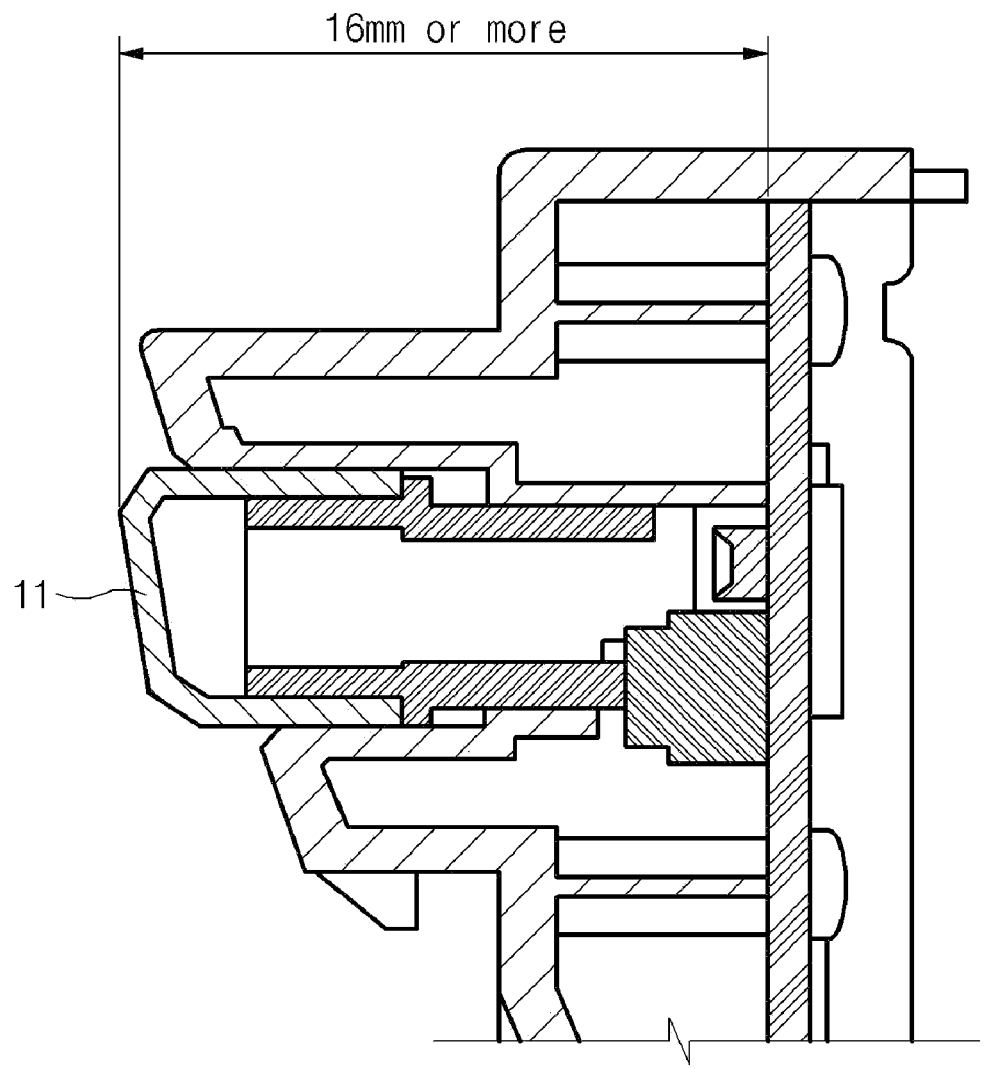
FIG. 2 is an exemplary section view of a button in the audio front panel of a buttoned switch type according to a prior art.

It should be understood that the appended drawings are not necessarily to scale, presenting a somewhat simplified representation of various preferred features illustrative of the basic principles of the invention. The specific design features of the present invention as disclosed herein, including, for example, specific dimensions, orientations, locations, and shapes will be determined in part by the particular intended application and use environment.

DETAILED DESCRIPTION OF THE PREFERRED EMBODIMENTS

As described herein, the present invention includes an input device for a touch panel type for a vehicle comprising a touch cell sensor unit composed of a plurality of touch cells that input a signal, and an LED driving unit.

In one embodiment, the input device includes a window panel that comprises a front side of a front panel and a front board that comprises a rear side of the front panel.

In another embodiment, the touch cells sense a change of pulse corresponding to a change of electric field.

In still another embodiment, the LED driving unit provides lighting as a feedback when the cell is touched.

In another further embodiment, each of the touch cells inputs the signal by sensing a change of the pulse corresponding to a change of electric field in case of being touched, respectively.

In another aspect, the invention features an audio front panel for a touch panel type for a vehicle, the audio front panel comprising a window panel, a touch cell sensor unit, an LED driving unit, an LED guide, and a front board that provides an interface between an audio box and the touch cell sensor unit.

In one embodiment, the window panel represents an outside of the audio front panel.

In another embodiment, the touch cell sensor unit is attached to a rear side of the window panel, and is comprised of a plurality of touch cells for sensing a change of electric field in case of touching.

In another further embodiment, the LED driving unit provides lighting as a feedback in case of touching the touch cell.

In another embodiment, the LED guide is formed at the rear side of the window panel, and for plays a role in a body for controlling the lighting between buttons.

With reference to the accompanying drawings, reference will now be made in detail to exemplary embodiments of the present invention. It is to be understood that the present invention may be embodied in various embodiments, which are not limited by the embodiments illustrated herein. In the accompanying drawings, some elements regardless of the description of the present invention are omitted in order to describe the present invention clearly, and, like reference numerals refer to the like elements throughout.

Preferably, the input device of the touch panel type for a vehicle according to an embodiment of the present invention as described herein may be suitably used for a panel input device including an audio front panel and a navigation front panel, or, in other embodiments, the input device of the touch panel type is suitably used for a switch for a vehicle such as, but not limited to, a switch for an air conditioner or a switch for a heater.

Figure 3:
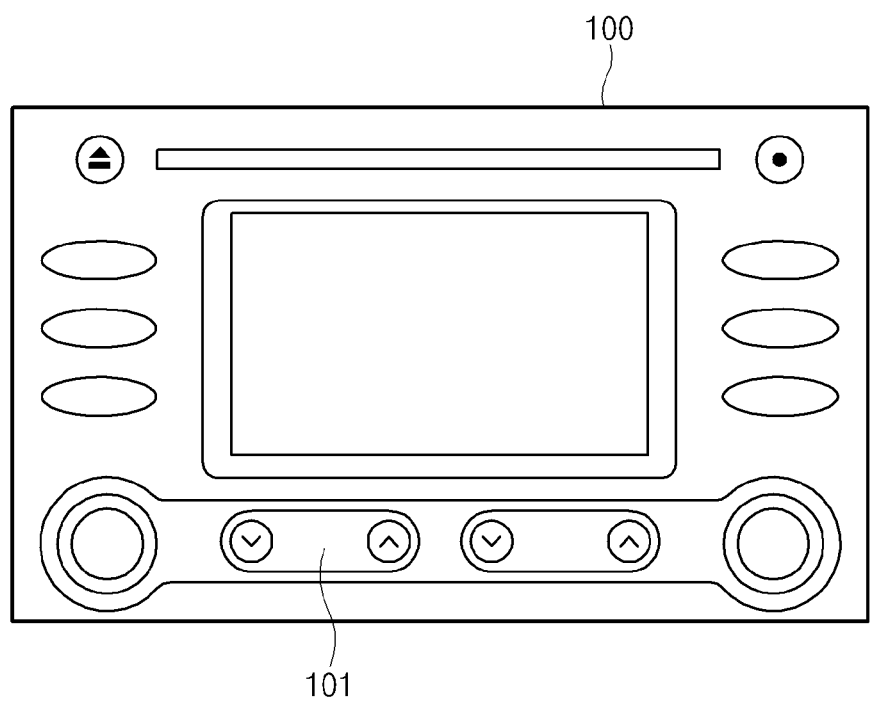
FIG. 3 is an exemplary view for illustrating an audio front panel of a touch panel type according to an embodiment of the present invention.
Figure 4:
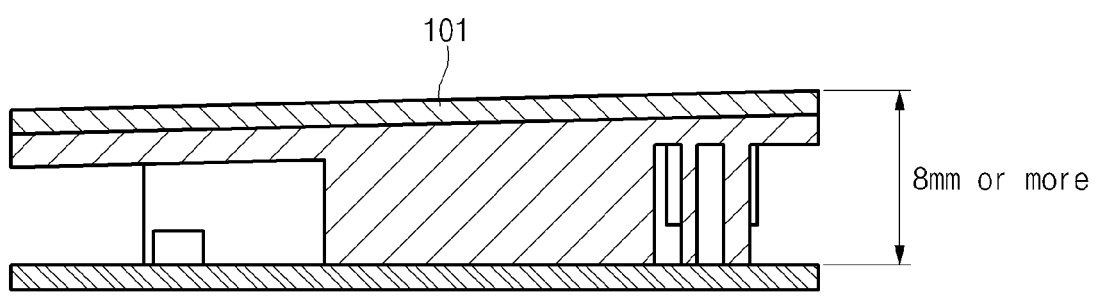
FIG. 4 is an exemplary section view of a button in an audio front panel of a touch panel type according to an embodiment of the present invention.

FIG. 3 is an exemplary view for illustrating an audio front panel of a touch panel type according to a preferred embodiment of the present invention. FIG. 4 is a section view of a button in an audio front panel of a touch panel type according to another preferred embodiment of the present invention.

In certain preferred embodiments, referring to FIG. 3 for example, the audio front panel 100 of a touch panel type may preferably include a touch panel button 101 structure of a sensor type for sensing a change of an electric field, and, as an aspect of a circuit, it may preferably include an interface for suitably sensing the change of an electric field and for suitably controlling an audio operation signal. Further, it may also provide a suitable feedback signal (a beep sound, a touch LED, or the like) in touching the button.

According to further preferred embodiments, the audio front panel 100 of a touch panel type, for example as shown in FIG. 4, is preferably designed to require a mounting space of at least 8 mm in order to suitably slim down the audio front panel, while the conventional audio front panel is designed to require a mounting space of at least 16 mm or more on the upper side of PCB (Printed Circuit Board) considering the distance for a switch manipulation.

According to certain preferred embodiments and referring to FIGS. 5 to 11 for example, an operating principle and a structure of the audio front panel 100 of a touch panel type according to preferred exemplary embodiments of the present invention are now explained in detail.

Preferably, the audio front panel 100 of a touch panel type according to an embodiment of the present invention is embodied by a touch cell of an electric field type, and the touch cell preferably inputs a signal by sensing a change of pulse corresponding to a change of an electric field in touching it.

Figure 5A:
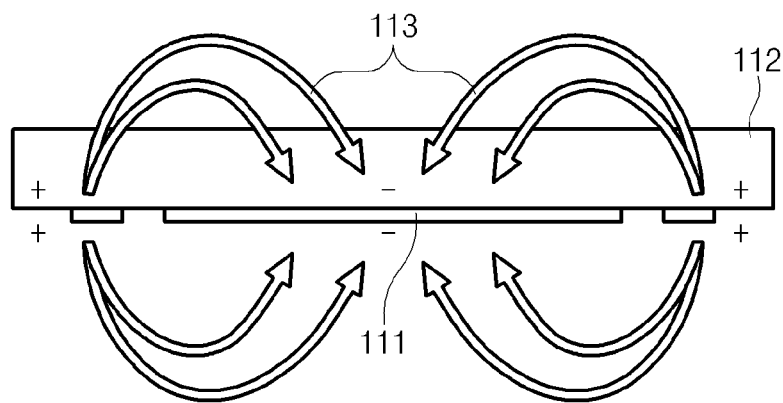
FIGS. 5A and 5B are exemplary views for explaining an operating principle of a touch sensor using electric field sensor according to an embodiment of the present invention.
Figure 5B:
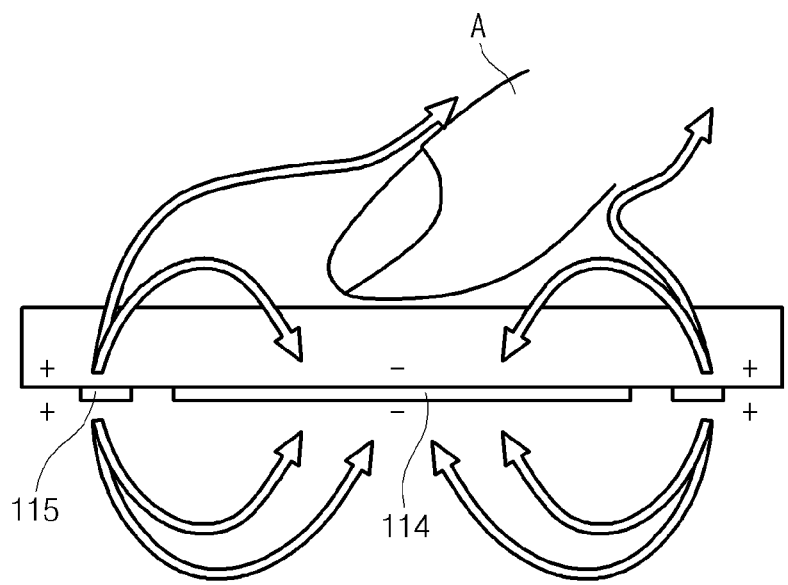
Figure 6A:
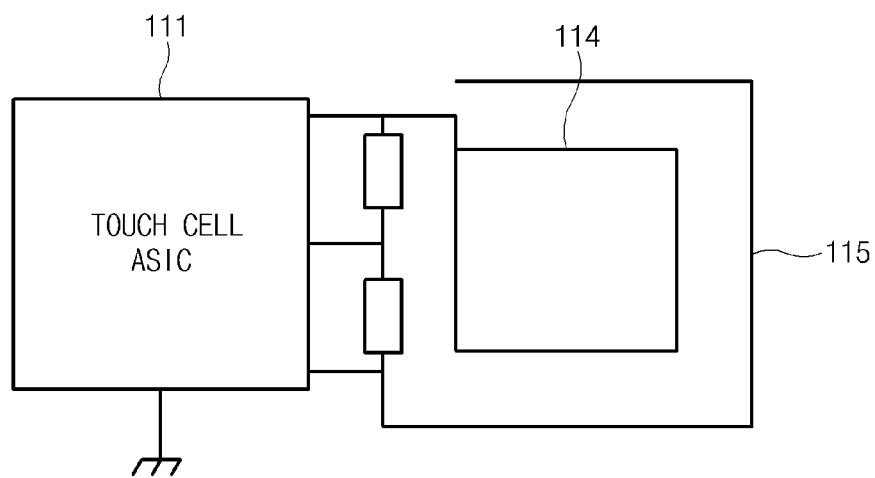
FIGS. 6A and 6B illustrate exemplary circuit diagrams of a touch cell according to an embodiment of the present invention, respectively.
Figure 6B:
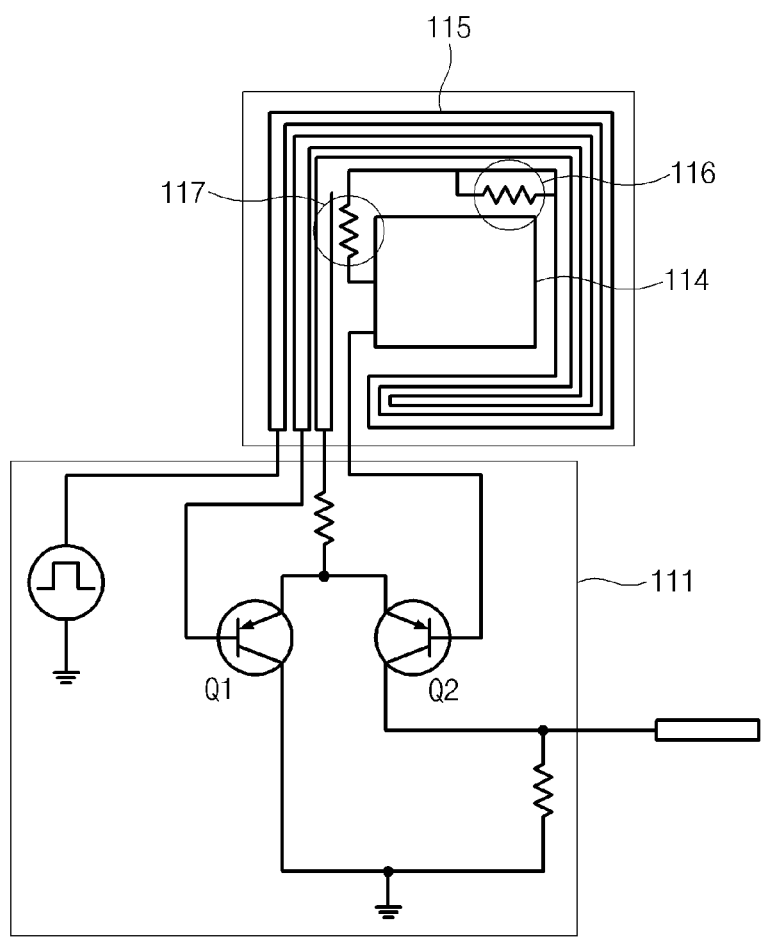

According to other preferred embodiments, for example as shown in FIGS. 5A and 5B, FIGS. 5A and 5B are exemplary views for explaining an operating principle of a touch sensor using an electric field sensor according to preferred embodiments of the present invention. FIGS. 6A and 6B illustrate exemplary circuit diagrams of a touch cell according to further preferred embodiments of the present invention.

The touch sensor using an electric field according to further preferred embodiments of the present invention may include a touch cell 111, a dielectric layer 112, an inner electrode 114 and an outside electrode 115, and a numeral reference of 113 that represents a sensor field.

According to other exemplary embodiments, FIG. 5A illustrates a touch sensor before a button is suitably pushed using a finger, and FIG. 5B illustrates a touch sensor in which the sensor field is suitably produced by pushing the touch panel with a finger and accordingly, an input signal is suitably produced by sensing the change of the electric field.

According to still other exemplary embodiments, for example as shown in FIG. 6A, the touch cell 111 preferably applies 5 volt to generate the electric field, and, for example, it may include one IC which is embodied by ASIC (Application-Specific Integrated Circuit) method, and two resistors 116 and 117. Preferably, in other further embodiments, the touch cell of the electric field type is able to suitably sense the change of the electric field where a conductive material is suitably touched to a part of the electric field. Further, the touch cell suitably provides a signal with suitably high stability, and that has suitably good reliability/durability, and is preferably attach to a curved surface. Further, with the touch cell it is possible to have a suitably fast response time and a suitably low defect rate in touching the button.

According to other preferred embodiments of the present invention, for example as shown in FIG. 6B, an electric field may occur between the outer electrode 115 and the inner electrode 114. Preferably, the resistor 116 and 117 suitably controls touch sensitivity. Further, the touch cell 11 which is embodied by ASIC method may suitably sense the change of the electric field, and output a sensor active signal.

According to further preferred embodiments of the present invention, in the input device of the touch panel type for a vehicle according to an embodiment of the present invention, by replacing the conventional switch of a tact type into a touch panel using an electric field sensor of ASIC, it is possible to suitably change an analog input method according to an operation of the conventional switch of the tact type into a digital input method according to electric signals.

Preferably, the front panel 100 of the touch panel type for a vehicle according to a preferred embodiment of the present invention may be suitably operated by sensing the change of the electric field in case of contacting a dielectric material or in case of touching the button. Preferably, it provides a beep sound as the feedback information in touching the button, and provides lighting as the feedback information in pushing the button. Further, a raised relief and bas-relief (volume) may be suitably formed at the button in order to easily manipulate the button during driving.

According to further exemplary embodiments of the present invention, the audio front panel 100 of a touch panel type preferably uses a high signal as an operating signal of a corresponding key when changing the electric field in each of touch cells corresponding to each of buttons, and preferably needs not to have an additional software. Preferably, since the additional software is not required, it is possible to suitably minimize a size of a signal processing unit. Further, since an additional algorithm is not required, it is possible to suitably improve the signal stability, and reduce a prime cost. Further, by improving a touch sensibility, it is possible to have a suitably fast responsive time for the signal.

Figure 7A:
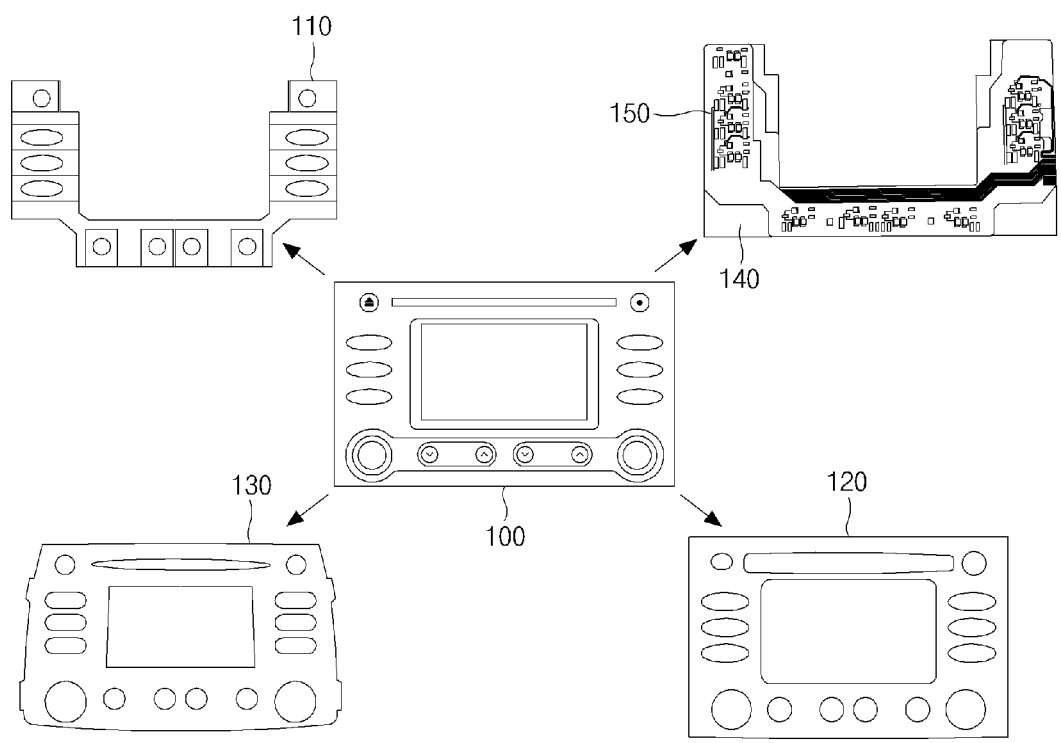
FIG. 7A is an exemplary view for illustrating components for constituting an audio front panel of a touch panel type according to an embodiment of the present invention.
Figure 7B:
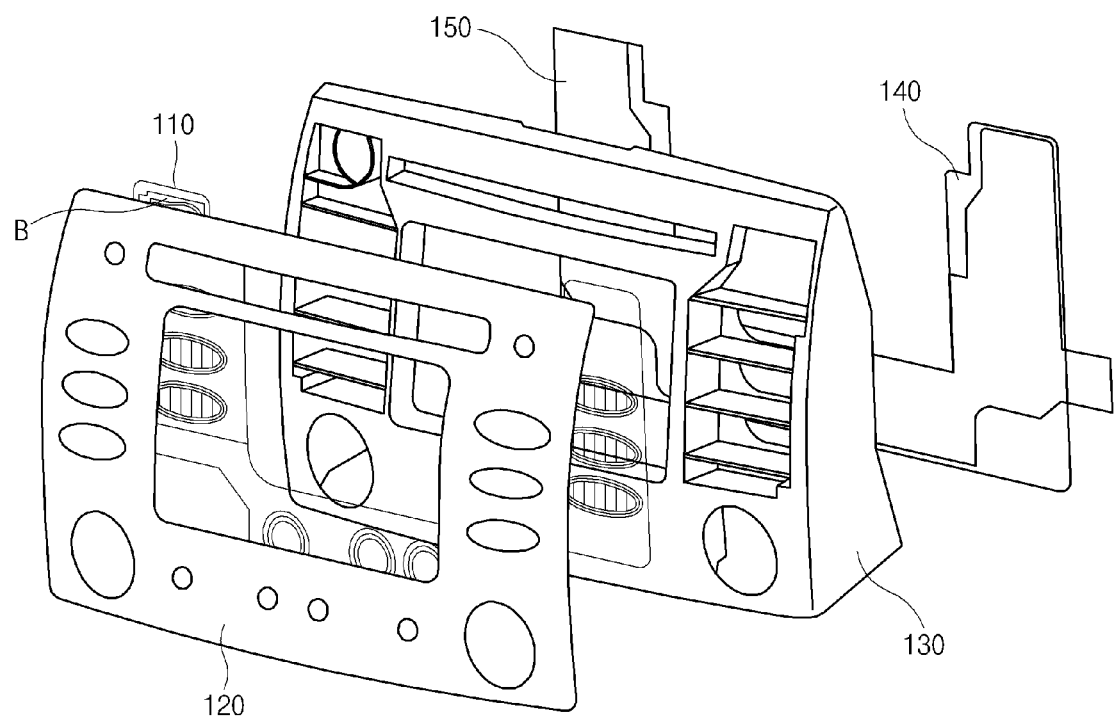
FIG. 7B is an exemplary view for showing an audio front panel of a touch panel type according to an embodiment of the present invention.

In other exemplary embodiments, for example, FIG. 7A is a view of components comprising an audio front panel of a touch panel type according to a preferred embodiment of the present invention. FIG. 7B is a view for showing an audio front panel of a touch panel type according to a further preferred embodiment of the present invention.

Referring to FIGS. 7A and 7B, in other exemplary embodiments, the audio front panel 100 of a touch panel type may preferably include a touch cell sensor unit 110, a window panel 120, an LED guide 130, a front board 140 and an LED driving unit 150. Preferably, the touch cell sensor unit 110, the front board 140 and the LED driving unit 150 may be suitably mounted on a printed circuit board PCB, respectively.

In other further embodiments, the window panel 120 is a panel for suitably representing the outside of the audio front panel according to another further embodiment of the present invention, and, for example, it may be formed by suitably applying an insert film manufacturing method.

Preferably, the touch cell sensor unit 110 may be attached to a rear side of the window panel 120, and also, it is suitably composed of a plurality of touch cells for sensing a change of electric field in case of touching the button. According to certain preferred embodiments, the touch cell sensor unit 110 may be a touch cell formed by a method of ASIC (Application-Specific Integrated Circuit), and it may be suitably mounted on a flexible PCB (FPCB). Preferably, a numeral reference of B represents a double-sided tape for attaching the touch cell sensor unit 110 to the window panel 120, and in certain exemplary embodiments it may be a double-sided tape manufactured by 3M. Preferably, the window panel 120 and the touch cell sensor unit 110 may be suitably integrated with each other for constituting a touch panel of a button-integrated type.

According to other preferred embodiments of the present invention, the LED driving unit 150 provides the lighting as a feedback in touching the button, and it may be suitably mounted on a flexible PCB (FPCB). Preferably, it provides the lighting as a suitable feedback by a touch LED when touching the touch cell.

Preferably, the LED guide 130 may be suitably formed at the rear side of the window panel 120, and it plays a role in a body for controlling the lighting between buttons.

In other further embodiments, the front board 140 is suitably formed at a rear side of the audio front panel, and it may be embodied in a shape of PCB in order to suitably provide an interface between an audio box (not shown) and the touch cell sensor unit 110. Preferably, the LED driving unit 150 may be suitably connected with the upper side of the front board 140.

In other preferred embodiments, a control unit is included in the audio system for the vehicle, in which the control unit receives a value which is suitably transmitted through a sensor film, and controls an operating status of the audio system.

In particular preferred embodiments, a micro control unit (MCU) is included in a circuit board which is suitably connected with a panel, in which the MCU receives a value which is transmitted through a sensor film, and converts the value into a signal for controlling the audio system. Preferably, the MCU may include a converter for suitably converting an analog signal into a digital signal, or for converting a digital signal into an analog signal, and a logic unit for suitably deciding, through a specific algorithm, whether the digital signal is valid or not.

The circuit operations of the audio front panel 100 of a touch panel type according to an embodiment of the present invention having the above-described structure will be explained later.

According to certain preferred embodiments of the present invention, the audio front panel 100 of a touch panel type embodies a suitably simple and high tech design. Preferably, since the panel is molded by an in-mold process, a mirror process, or the like, it is possible to suitably diversify materials of the panel. In addition, it is possible that the panel is easily integrated with a design such as a skin, a line, a color diversification, and further it is possible to suitably minimize the parting lines.

Further, in the audio front panel 100 of a touch panel type according to another preferred embodiment of the present invention, since it needs just a minimum mounting space of 8 mm for mounting a button, it is possible to suitably improve utilization of the inner space in the vehicle and to unify the panel. In further preferred embodiments, by minimizing the number of parts, it is possible to suitably reduce molding cost, and to suitably decrease a period for developing the parts. Further, it is possible to suitably improve feeling quality since operation feeling of the button is uniform.

Figure 8:
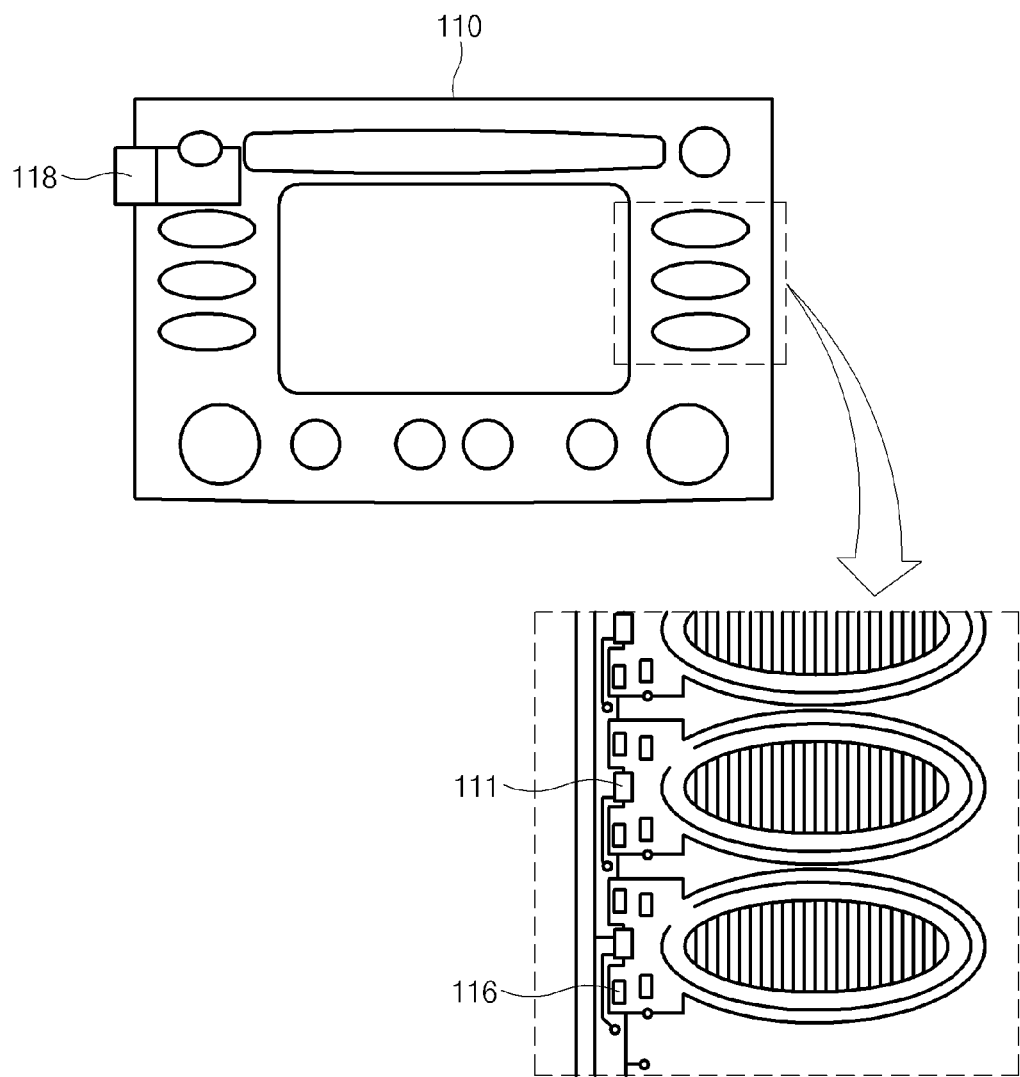
FIG. 8 is an exemplary view for illustrating a touch cell sensor unit in an audio front panel of a touch panel type according to an embodiment of the present invention.

According to other exemplary embodiments, FIG. 8 is a view for illustrating a touch cell sensor unit in an audio front panel of a touch panel type.

Preferably, the touch cell 111 for applying a power source and for sensing an electric field, for example as shown in FIG. 8, may be embodied by ASIC method, and the touch cell sensor unit 110 on which a resistor 116 for controlling a touch sensibility is suitably mounted, may preferably be connected with a flexible cable 118 at one side of the resistor 116.

Figure 9:
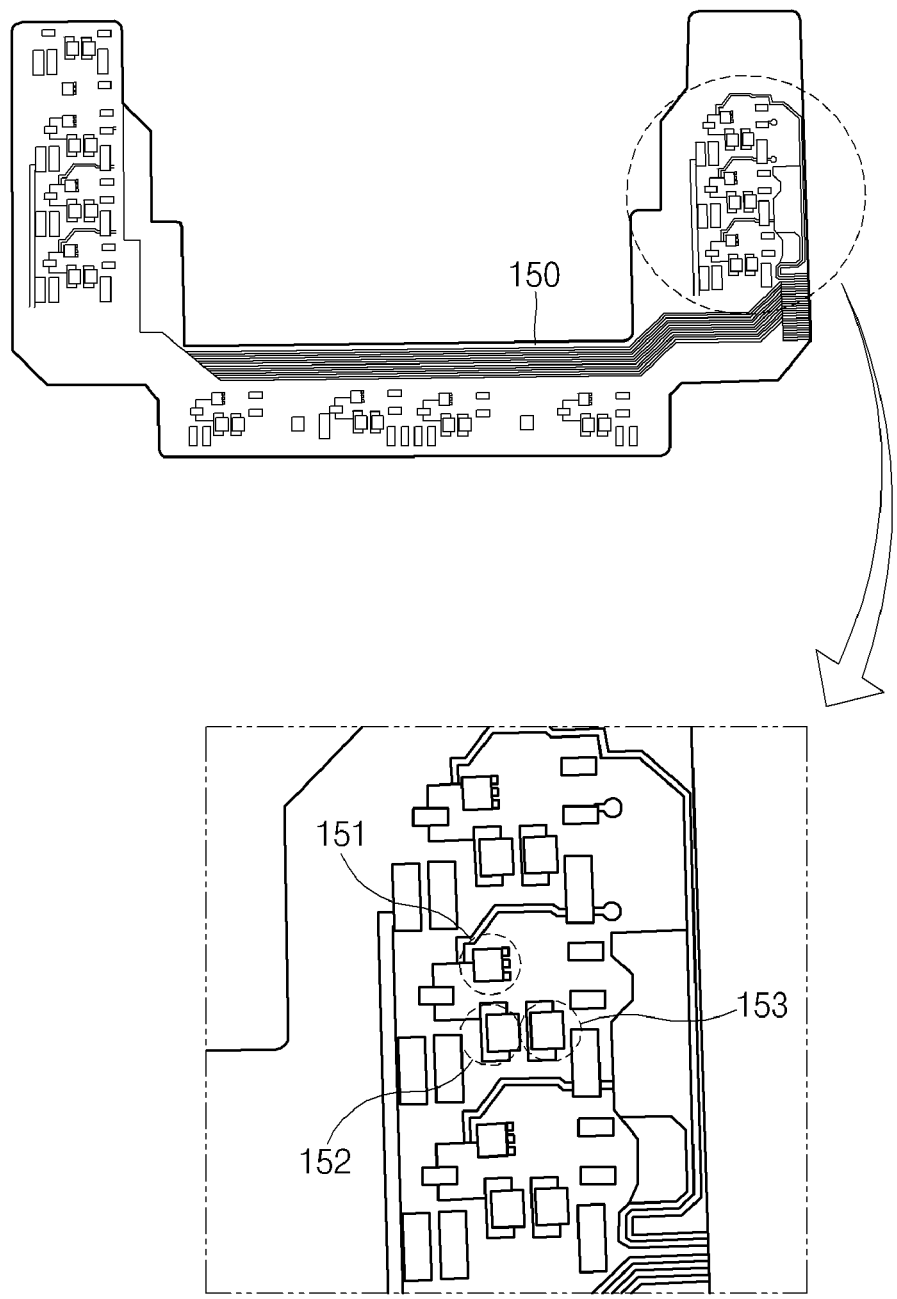
FIG. 9 is an exemplary view for illustrating an LED sensor unit in an audio front panel of a touch panel type according to an embodiment of the present invention.

FIG. 9 is a view for illustrating an LED sensor unit in an audio front panel of a touch panel type according to another preferred embodiment of the present invention.

Preferably, the LED sensor unit 150, as shown in FIG. 9, may mount an LED control IC 151 for suitably controlling lighting of LED when a touch signal is applied while an ILL (Illumination) LED is turned on, an ILL LED 152 for turning on when an ILL (Illumination) signal for a vehicle is turned on, and a touch LED 153 for turning on when the button is touched.

Figure 10:
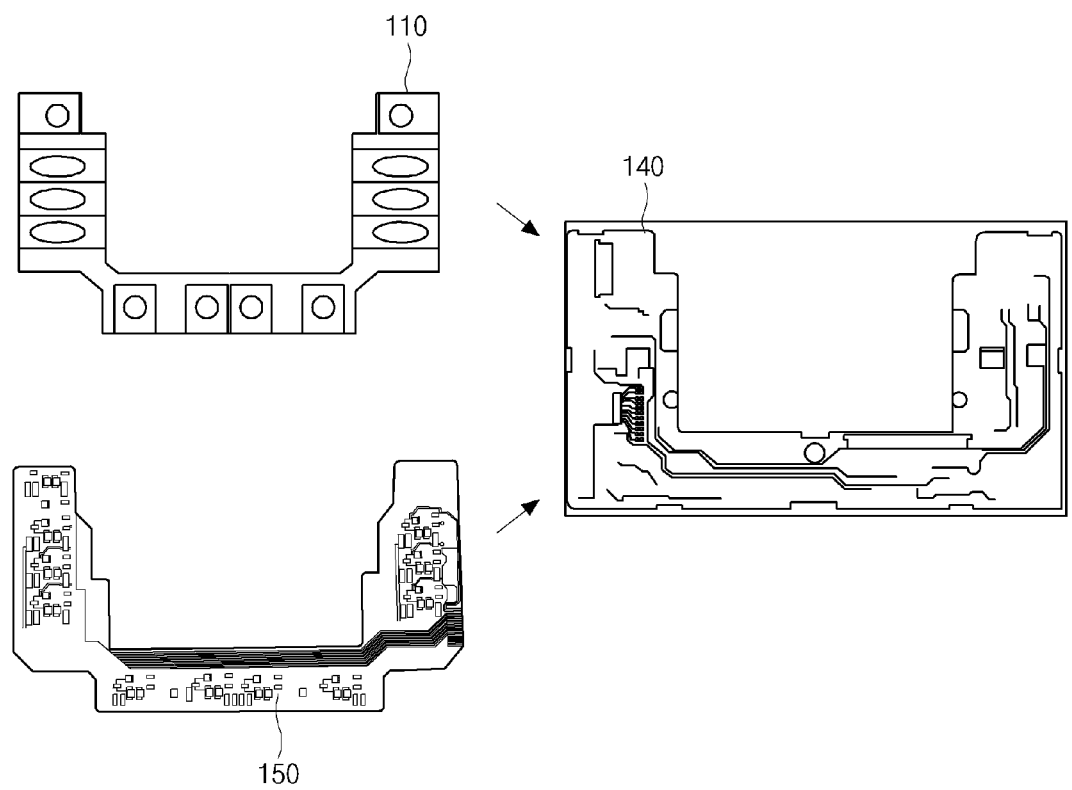
FIG. 10 is an exemplary view for illustrating a connection of PCBs in an audio front panel of a touch panel type according to an embodiment of the present invention.

According to other preferred embodiments, FIG. 10 is a view for illustrating a connection of PCBs in an audio front panel of a touch panel type.

FIG. 10 illustrates a method for connecting components to the PCB in the audio front panel of a touch panel type according to a preferred embodiment of the present invention, wherein a touch cell PCB on which the touch cell sensor unit 110 is suitably mounted, and an LED PCB on which the LED driving unit 150 is suitably mounted, are connected with a front PCB of the front board 140, respectively. Here, the touch cell PCB and the LED PCB may preferably be embodied by a flexible PCB (FPCB), respectively.

According to other preferred embodiments of the present invention, the touch cell PCB suitably senses the touch signal and transmits the input signal. Preferably, the LED PCB is to drive ON/OFF of the ILL (Illumination) signal. Preferably, the front PCB suitably connects the input signal of each of the FPCBs, and suitably communicates a main terminal of the audio system for a vehicle. Preferably, two inter connectors may be used to suitably connect two FPCBs, and the front board may be suitably patterned so that each of connector signals is matched to 1:1.

Figure 11:
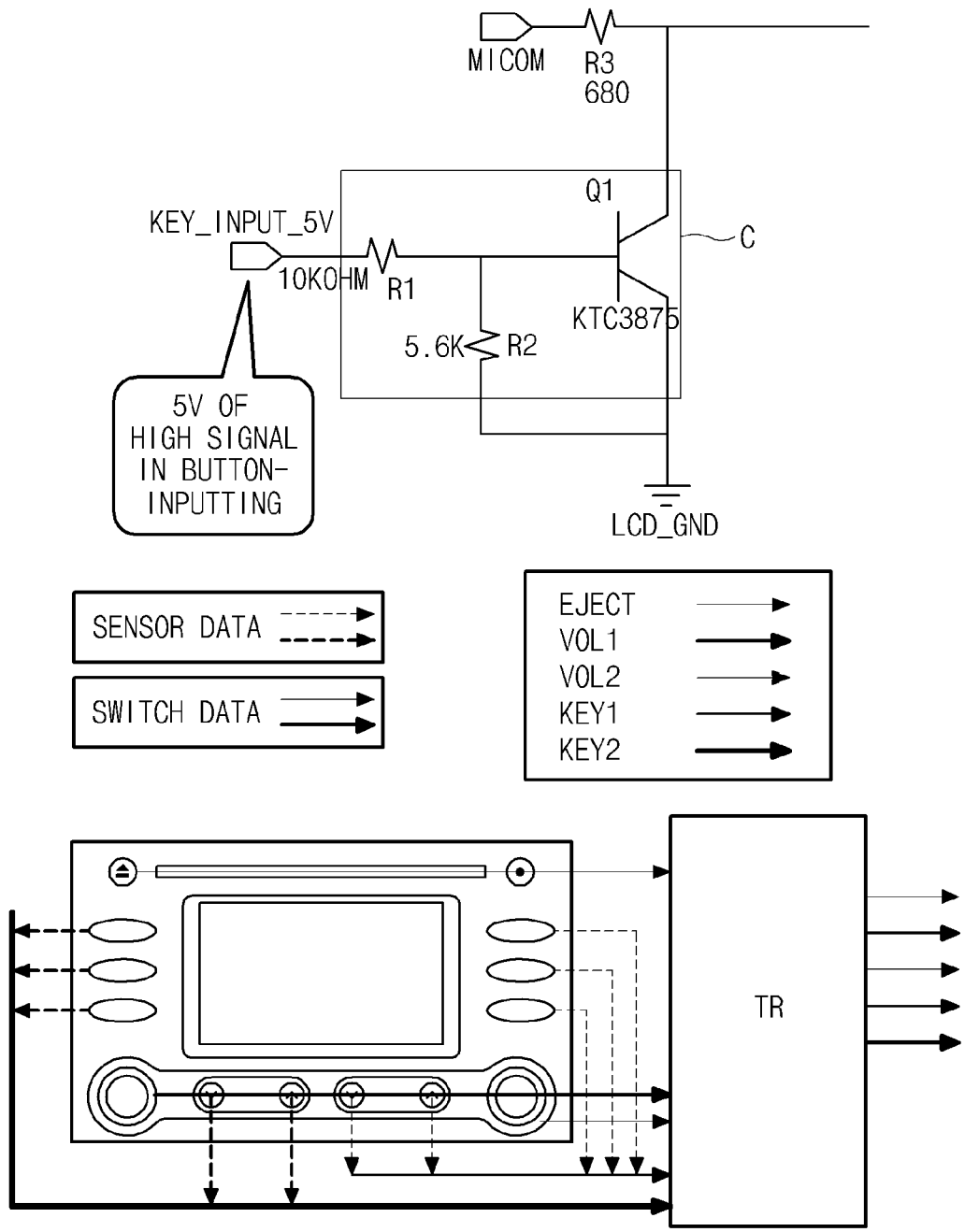
FIG. 11 is an exemplary view for explaining an operation of a touch key driving unit in an audio front panel of a touch panel type according to an embodiment of the present invention.

In other further preferred embodiments, for example as shown in FIG. 11, FIG. 11 illustrates operation of a touch key driving unit in an audio front panel of a touch panel type according to a preferred embodiment of the present invention.

Referring to FIG. 11, in the audio front panel of a touch panel type according to a preferred embodiment of the present invention, the touch key driving unit may mount two resistors and one transistor on each of the PCBs in order to suitably correspond to an input of the touch cell. Preferably, a space for the PCB may be a width of 7.3 mm and a height of 3.5 mm in case where components for the each of the buttons are suitably mounted.

Accordingly, an operating procedure of the touch key in the audio system for a vehicle according to certain preferred embodiments of the present invention is as follows.

First, a power source is suitably applied to the audio system for a vehicle, and then, a voltage of 5V is suitably applied to a sensor. Next, a transistor of Q1 is turned-on by a voltage dividing of resistors R1 and R2. Further, in case where PHONE_B of the above-described touch cell sensor unit is more than 1.8V, it may suitably recognize that the key is inputted.

Further, in certain examples where the key is turned on, a voltage corresponding to the function of the key is suitably outputted, and a sound is reproduced.

Figure 12:
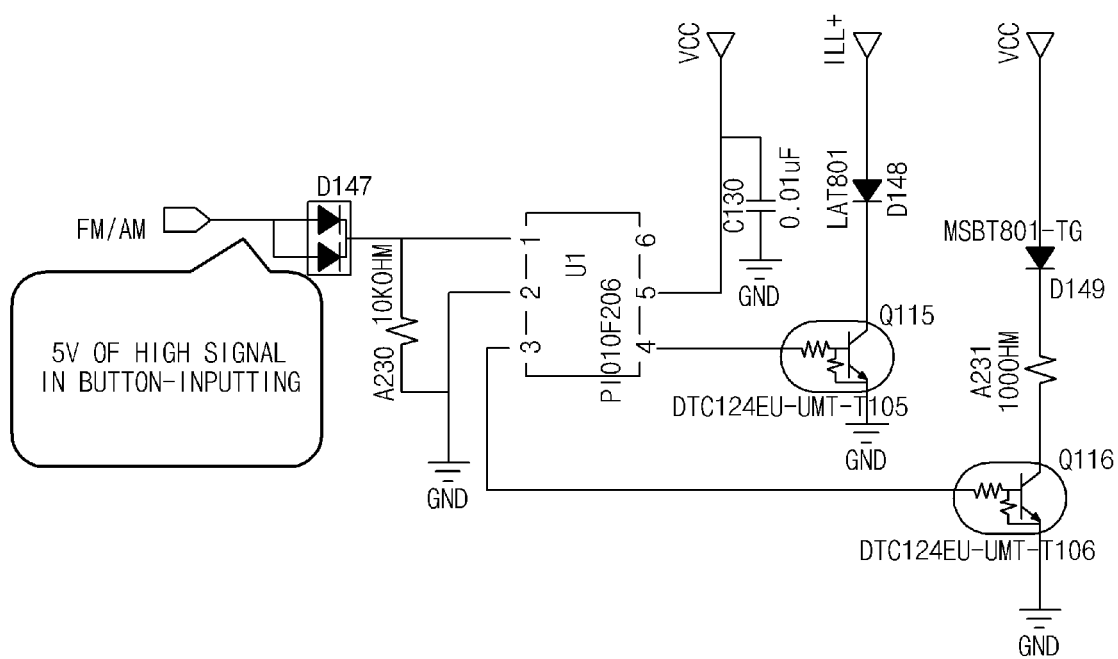
FIG. 12 is an exemplary view for explaining an operation of an LED driving unit in an audio front panel of a touch panel type according to an embodiment of the present invention.

In other further embodiments, FIG. 12 is a view for explaining an operation of an LED driving unit in an audio front panel of a touch panel type.

Referring to FIG. 12, for example, an operating procedure of the LED driving unit 150 in the audio front panel of a touch panel type according to a preferred embodiment of the present invention described herein. That is, in the audio front panel of a touch panel type according to an embodiment of the present invention, FIG. 12 illustrate that a blue LED or a red LED is turned on/off by the LED driving unit 150.

In a first exemplary embodiment, Vcc (5V) for driving a control IC inside of the LED is suitably applied. Further, a power source of ILL+ for driving ILL (Illumination) is suitably applied.

Further, when the ILL is turned off, KEY (FM/AM) is suitably applied through the Vcc (5V), and accordingly, a transistor of Q116 is turned on so that the blue LED is turned on.

Next, when the ILL is turned on, KEY (FM/AM) is not applied through the ILL+ power source of the button, and accordingly, a transistor of Q115 is turned on so that the red LED is turned on.

In another further embodiment, when the ILL is turned on, KEY (FM/AM) is suitably applied through the ILL+ power source of the button, and accordingly, a transistor of Q115 is turned off so that a red LED is turned off, and, at the same time, a transistor of Q116 is turned on so that the blue LED is turned on.

Figure 13:
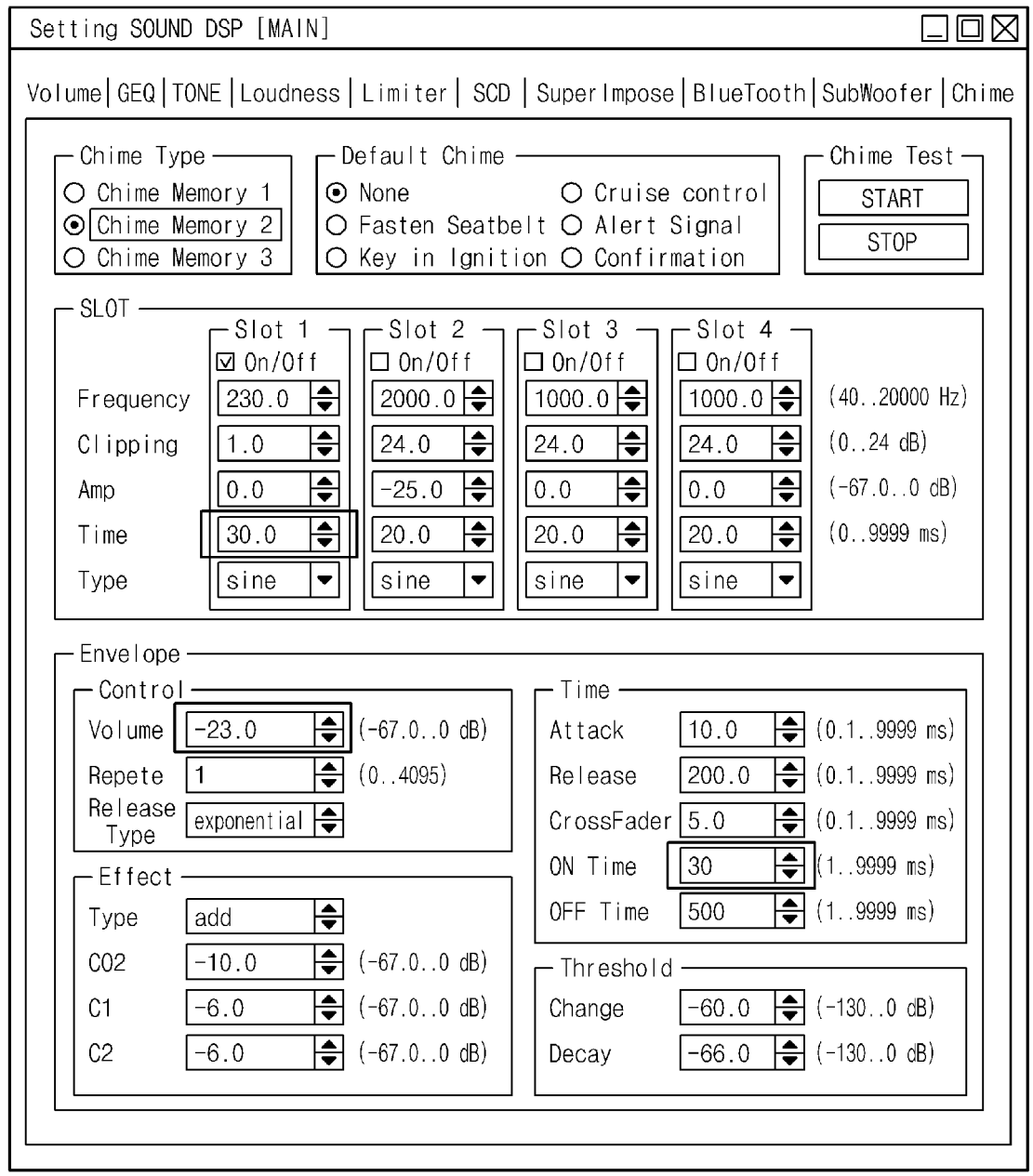
FIG. 13 is an exemplary view for explaining an output of a beep sound in case of touching a button in an audio front panel of a touch panel type according to an embodiment of the present invention.

FIG. 13 is an exemplary view for explaining an output of a beep sound in examples of touching a button in an audio front panel of a touch panel type according to preferred exemplary embodiments of the present invention.

As shown in FIG. 13, for example, in the in audio front panel of the touch panel type according to certain preferred embodiments of the present invention, when the button is suitably touched, a beep sound may be suitably outputted, wherein, the beep sound is reproduced using a POLY CHIME inside of a digital signal processor (DSP) for sound. For example, it is possible to suitably operate with 4POLY, and it is also possible to set up a frequency of 230 KHz, a slot time of 30 ms, an on time of 30 ms and a volume level of −23 dB.

Preferably, although a feedback for the user's input may be suitably formed through a change of physical status (a movement of up-and-down or the front and the rear in the button corresponding to a pushed pressure) which may be recognized by a user when a touch cell is suitably inputted, in case where a feedback is suitably performed through various buzzer sounds in the input device, it is possible to allow a user to provide adequate conveniences.

Figure 14:
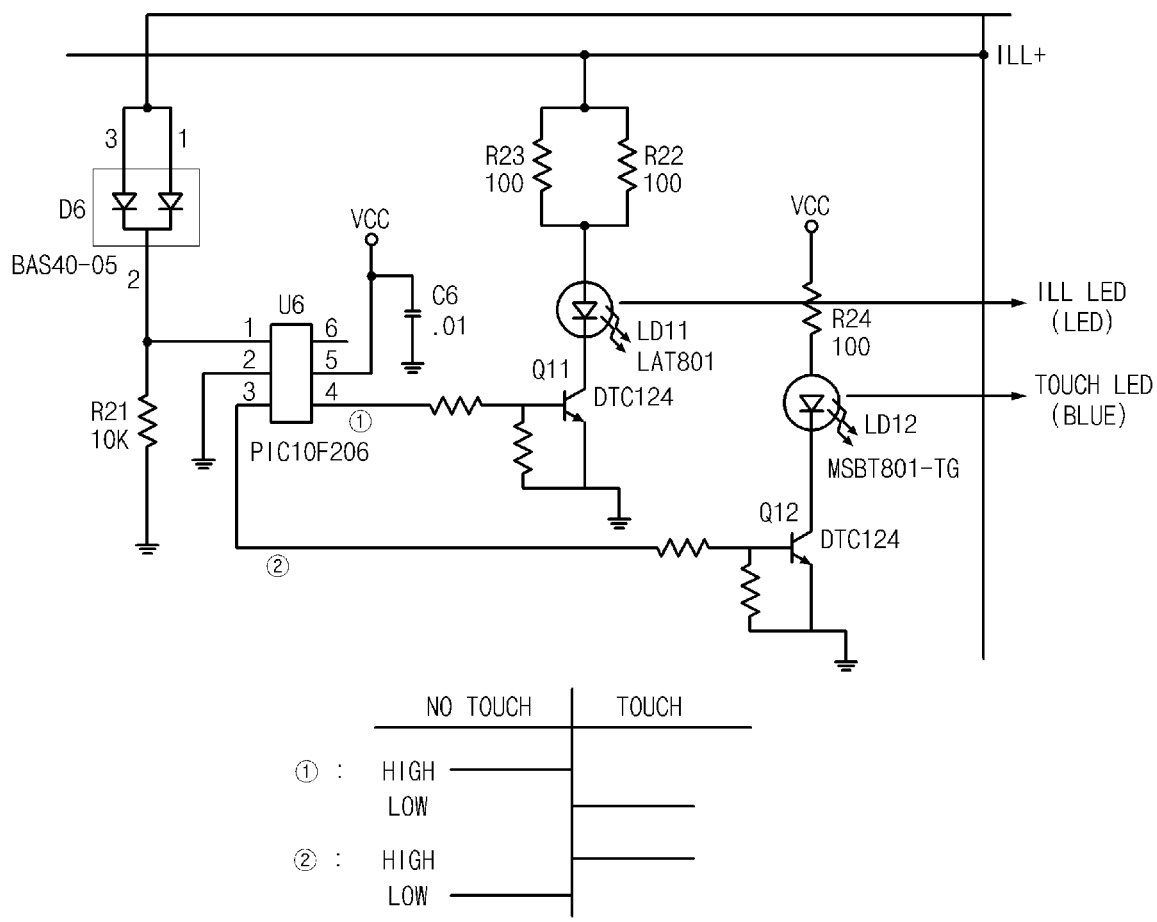
FIG. 14 is an exemplary view for explaining an output of LED in case of touching a button in an audio front panel of a touch panel type according to an embodiment of the present invention.

In other certain embodiments, for example as shown in FIG. 14, FIG. 14 shows an exemplary view for explaining an output of LED when a button is touched in an audio front panel of a touch panel type according to an embodiment of the present invention.

FIG. 14 illustrates a status that a blue LED is outputted when a button is touched in the audio front panel of a touch panel type according to a certain preferred embodiment of the present invention. Preferably, if a touch is performed when ILL (Illumination) lighting is turned on, the ILL lighting is suitably turned off, and then, it is able to output touch lighting.

Accordingly, in the audio front panel of a touch panel type according to preferred embodiments of the present invention, by replacing the conventional switch of a tact type into a touch panel using an electric field sensor, it is possible to suitably change the analog input method according to an operation of the conventional switch of the tact type into the digital input method according to electric signals. Further, by a touch panel of a button-integrated type for sensing a change of an electric field, it is possible to suitably improve utilization of the inner space in the vehicle, and unify the panel.

The foregoing description of the present invention is intended to be illustrative, and those of ordinary skill in the art will understand that the present invention may be changed into other specific forms without modifying technical conceptions or essential characteristics according to the present invention. Therefore, it must be understood that the above-described embodiment is to be illustrative not to be definitive.

The present invention is intended to fall within the scope of the following appended claims not within the scope of the detailed description, and accordingly, it must be understood that the meaning and scope of the appended claims and all such changes, modifications and variations induced by the equivalents are included in the scope of the present invention.

What is claimed is:

1. An input device for a touch panel type for a vehicle, in which the input device includes a window panel for constituting a front side of a front panel and a front board for constituting a rear side of the front panel, the input device comprising:

a touch cell sensor unit composed of a plurality of touch cells for sensing a change of pulse corresponding to change of electric field and configured to input a signal; and a light emitting diode (LED) driving unit configured to provide lighting as a feedback in case of touching the touch cell, wherein each of the touch cells inputs the signal by sensing the change of the pulse corresponding to the change of electric field in case of being touched, respectively, and when Illumination (ILL) is turned off and an operating signal of corresponding key is applied through a power source for driving a control integrated circuit inside of each LED, a first LED is turned on, and when the ILL is turned on and the operating signal of corresponding key is not applied through a ILL power source of a button, a second LED is turned on, and when the ILL is turned on and the operating signal of corresponding key is applied through the ILL power source of the button, the second LED is turned off and the first LED is turned on, the first and second LED configured as different colors.

2. The input device of claim 1, further comprising an LED guide formed at the rear side of the window panel, wherein the LED guide plays a role in a body for controlling the lighting between buttons.

3. The input device of claim 1, wherein the window panel and the touch cell sensor unit are integrated with each other for constituting a touch panel of a button-integrated type.

4. The input device of claim 1, wherein the touch cell sensor unit is a touch cell formed by a method of ASIC (Application-Specific Integrated Circuit), and it is mounted on a flexible PCB (FPCB).

5. The input device of claim 1, wherein the LED driving unit is mounted on a flexible PCB (FPCB).

6. The input device of claim 1, wherein, as the feedback information in touching the touch cell, a beep sound is provided.

7. The input device of claim 1, wherein, as the feedback information in touching the touch cell, the lighting is provided by a touch LED.

8. The input device of claim 1, wherein the window panel and the touch cell sensor unit are mutually attached using a double-sided tape.

9. The input device of claim 1, wherein the input device of the touch panel type is used for a panel input device including an audio front panel and a navigation front panel, or the input device of the touch panel type is used for a switch for an air conditioner or a switch for a heater.

10. An audio front panel for a touch panel type for a vehicle, the audio front panel comprising:
a window panel operating as an outside of the audio front panel;
a touch cell sensor unit configured to be attached to an rear side of the window panel, and composed of a plurality of touch cells for sensing a change of electric field in case of touching;
an LED driving unit configured to provide lighting as feedback when the touch cell is touched;
an LED guide formed at the rear side of the window panel, and configured to control lighting between buttons; and
a front board constituting a rear side of the audio front panel, and configured to provide an interface between an audio box and the touch cell sensor unit,
wherein when Illumination (ILL) is turned off and an operating signal of corresponding key is applied through a power source for driving a control integrated circuit inside of each LED, a first LED is turned on, and when the ILL is turned on and the operating signal of corresponding key is not applied through a ILL power source of a button, a second LED is turned on, and when the ILL is turned on and the operating signal of corresponding key is applied through the ILL power source of the button, the second LED is turned off and the first LED is turned on, the first and second LED configured as different colors.

11. The audio front panel of claim 10, wherein the window panel and the touch cell sensor unit are integrated with each other for constituting a touch panel of a button-integrated type.

12. The audio front panel of claim 10, wherein the touch cell sensor unit is a touch cell formed by a method of ASIC (Application-Specific Integrated Circuit), and it is mounted on a flexible PCB (FPCB).

13. The audio front panel of claim 10, wherein the LED driving unit is mounted on a flexible PCB (FPCB).

14. The audio front panel of claim 10, wherein, as the feedback information in touching the touch cell, a beep sound is provided.

15. The audio front panel of claim 10, wherein, as the feedback information in touching the touch cell, the lighting is provided by a touch LED.

16. The audio front panel of claim 10, wherein the window panel and the touch cell sensor unit are attached using a double-sided tape.

* * * * *